United States Patent
Launay

(10) Patent No.: US 9,615,457 B2
(45) Date of Patent: Apr. 4, 2017

(54) ELECTRONIC ENTITY WITH COUPLING INTEGRATED BETWEEN A MICROCIRCUIT AND AN ANTENNA AND METHOD OF FABRICATION

(71) Applicant: OBERTHUR TECHNOLOGIES, Colombes (FR)

(72) Inventor: Francois Launay, Colombes (FR)

(73) Assignee: OBERTHUR TECHNOLOGIES, Colombes (FR)

( * ) Notice: Subject to any disclaimer, the term of this patent is extended or adjusted under 35 U.S.C. 154(b) by 0 days.

(21) Appl. No.: 14/909,164

(22) PCT Filed: Jul. 30, 2014

(86) PCT No.: PCT/FR2014/051983
§ 371 (c)(1),
(2) Date: Feb. 1, 2016

(87) PCT Pub. No.: WO2015/015121
PCT Pub. Date: Feb. 5, 2015

(65) Prior Publication Data
US 2016/0192485 A1  Jun. 30, 2016

(30) Foreign Application Priority Data

Jul. 31, 2013 (FR) ...................................... 13 57589

(51) Int. Cl.
*G06K 19/06* (2006.01)
*H05K 1/11* (2006.01)
(Continued)

(52) U.S. Cl.
CPC ......... *H05K 1/11* (2013.01); *G06K 19/07756* (2013.01); *G06K 19/07779* (2013.01); *G06K 19/07794* (2013.01); *H05K 1/18* (2013.01)

(58) Field of Classification Search
CPC ....... G06K 19/07756; G06K 19/07779; G06K 19/07794; H05K 1/11; H05K 1/18
(Continued)

(56) References Cited

U.S. PATENT DOCUMENTS 6,378,774 B1  4/2002 Emori et al.
8,322,624 B2*  12/2012 Finn .................. G06K 19/0723
235/492

(Continued)

FOREIGN PATENT DOCUMENTS

EP  1 031 939 A1  8/2000
EP  2 525 304 A1  11/2012

OTHER PUBLICATIONS

International Search Report, dated Oct. 9, 2014, from corresponding PCT application.

*Primary Examiner* — Seung Lee
(74) *Attorney, Agent, or Firm* — Young & Thompson

(57) ABSTRACT

An electronic entity includes a module formed of a support film carrying, on an internal face, a microcircuit and a first coupling coil, and a body including a cavity in which this module is fixed, the support film having an external surface running at least approximately alongside an upper surface of this body, and containing an antenna and a second coupling coil connected to this antenna and intended for the coupling of the antenna with the microcircuit by electromagnetic coupling with the first coupling coil; this second coupling coil (likewise may be the case for the antenna and the first coupling coil) is formed on a thickness of at most a few microns in a plane situated, with respect to the upper surface of the body, at a distance of less than half the distance with respect to the surface opposite from this upper surface of this body.

20 Claims, 2 Drawing Sheets

(51) Int. Cl.
   *G06K 19/077*   (2006.01)
   *H05K 1/18*     (2006.01)
(58) Field of Classification Search
   USPC .......................................................... 235/492
   See application file for complete search history.

(56) References Cited

U.S. PATENT DOCUMENTS

| | | |
|---|---|---|
| 9,104,954 B2 | 8/2015 | Buyukkalender et al. |
| 9,324,020 B2* | 4/2016 | Nazarov .......... G06K 19/07372 |
| 2012/0074233 A1 | 3/2012 | Finn et al. |
| 2014/0361086 A1* | 12/2014 | Finn ........................ B05D 3/06 |
| | | 235/488 |

* cited by examiner

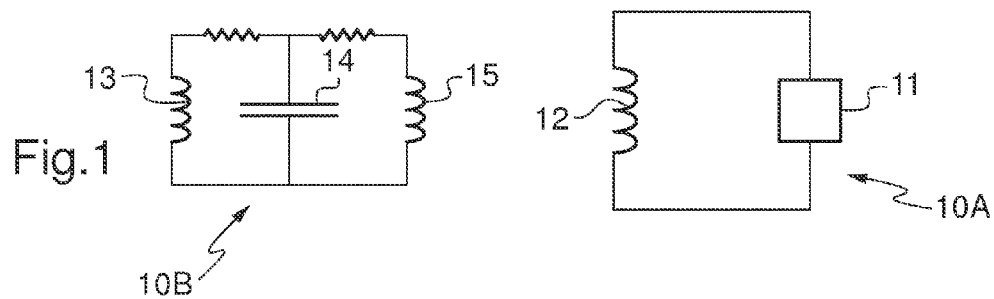
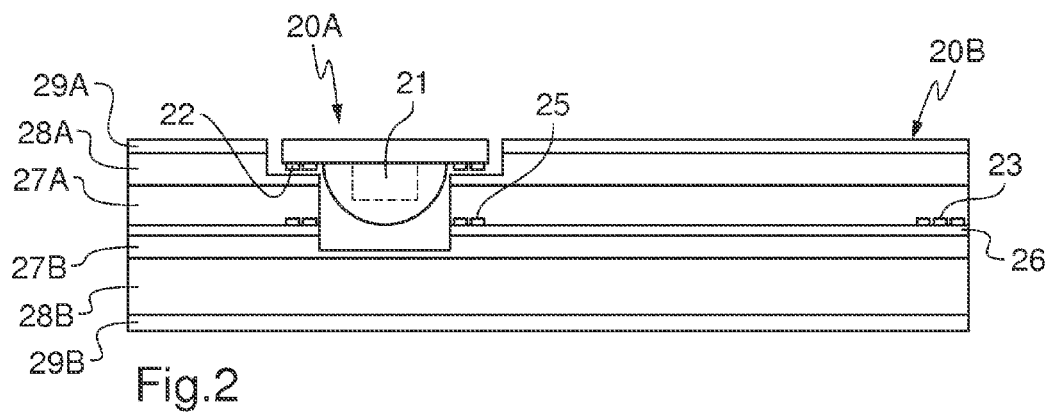
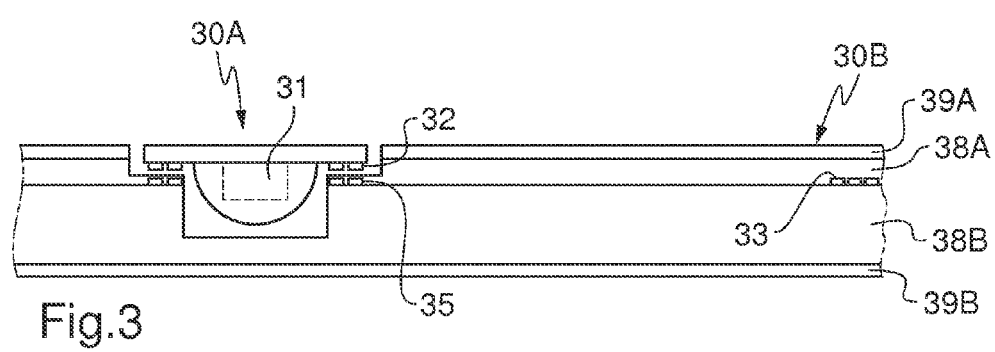
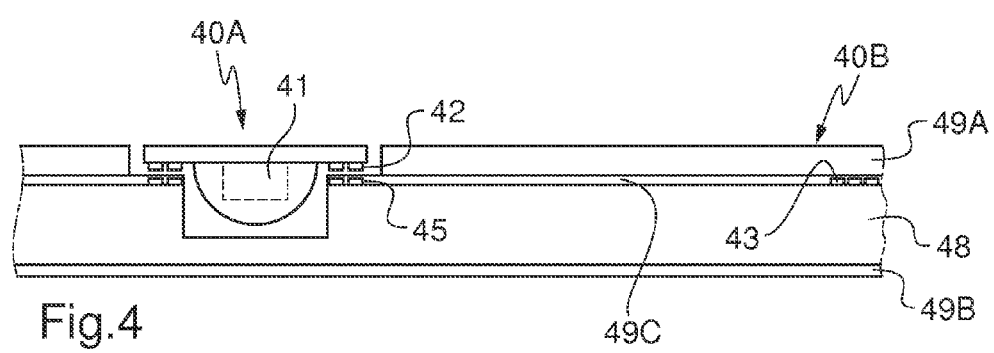

ELECTRONIC ENTITY WITH COUPLING INTEGRATED BETWEEN A MICROCIRCUIT AND AN ANTENNA AND METHOD OF FABRICATION

BACKGROUND OF THE INVENTION

Field of the Invention

The invention relates to an electronic entity with integrated coupling between a microcircuit and an antenna, in particular an electronic entity having a dual interface, i.e. an entity comprising, on the one hand, a module for communicating by contact and, on the other hand, a body in which the module is incorporated and that is equipped with an antenna for contactless communication. Such an entity may be a microcircuit card as defined by ISO-7816.

Description of the Related Art

Conventionally, an entity having such a dual interface comprises two electromagnetic coupling coils (or antennas) that are respectively located in the plane of the antenna and on the module; in FIG. 1, the module 10A is shown diagrammatically by the component on the right, comprising a microcircuit 11 and a coupling coil (there are additionally contacts for connecting to an external reader, but for the sake of simplicity, these are not shown), while the body 10B is shown diagrammatically on the left with an antenna 13 that is connected, via a capacitor 14, to a second coupling coil 15. The quality of the connection between the microcircuit and the antenna depends on the quality of the coupling between the coils 12 and 15.

Such a configuration is, for example, described in the document U.S. Pat. No. 6,378,774 (or its European equivalent, EP-1 031 939) relating to a microcircuit card. The module therein is, as is conventional, formed from a carrier film having a first face, called the outer face, comprising contact areas, and a second face, called the inner face, fixed to which is a microcircuit connected to the contact areas through the carrier film. The card body therein comprises a carrier sheet on which, on the one hand, the antenna and, on the other hand, the other coupling coil are formed, which may be equally on the outside of the antenna as on the inside thereof; the card body is formed by the injection molding, on both sides of the carrier sheet, of a material that, in practice, is similar to that of this sheet; in the body thus formed a cavity is then formed in which the module is fixed; the coupling coil formed on the carrier sheet is localized there so as to be in proximity of the coil of the module when this module is fixed in this cavity. According to one embodiment, the position for the carrier sheet is located below the cavity and the coupling coil borne by the module is formed on this second face; the gap between the two coupling coils is then of the order of magnitude of the depth of the cavity. In another embodiment, the coil borne by the module is wound around the microcircuit and the cavity passes through, at least partly, the carrier sheet of the antenna; the coupling coil formed in this carrier sheet is then located approximately at the same depth as the coupling coil of the module, but laterally removed therefrom.

According to yet another embodiment (see the document EP-2 525 304), the coupling coil located in the plan of the antenna may be formed by a portion of this antenna which is locally shaped in a suitable manner.

In practice, two ways for forming a card body (and more generally for forming the body of an electronic entity) are known; either by overmolding (in practice by injection molding) over a carrier sheet, as proposed in the aforementioned documents U.S. Pat. No. 6,378,774 or EP-1 031 939), or by lamination of a plurality of layers (see the diagram of FIG. 2), namely two (optional) compensating layers 27A and 27B to compensate for local variations in thickness resulting from the formation of the antenna 23 and of the associated coupling coil 25 on the carrier sheet 26, two core layers 28A and 28B that are located respectively on either side of the carrier sheet (and of potential compensating layers) and bearing the visual patterns intended for the card, and two covering layers 29A and 29B ensuring the protection of the underlying layers.

In practice, the carrier sheet 26 may be made of polyethylene terephthalate (PET for short), but may also be produced from a material such as polyvinyl chloride (or PVC) or polycarbonate (or PC for short): these are generally rigid materials. The compensating layers 27A and/or 27B may be formed from one of the aforementioned materials, as may the core layers; if these layers are formed from one and the same material, the interfaces between these layers may be hardly detectable. The covering layers, the function of which is mainly to protect the underlying layers, are often transparent.

The various known solutions are generally complex to implement (numerous layers, or overmolding by injection; restrictions in the choice of the materials considering the deposition-etching operations conventionally used; formation of the coil around the microcircuit, etc.) and do not allow both a small distance between the coupling coils (hence an effective coupling) and good reproducibility of this relative configuration between these coupling coils to be obtained.

On this subject, it may be recalled that:
the tolerances for positioning the antenna on the carrier sheet are typically of the order of 0.5 mm,
the tolerances for printing the visual patterns are typically of the order of 0.1 to 0.2 mm,
the tolerances for superposing the stack of layers are typically of the order of 0.2 to 0.3 mm,
the laminating tolerances are typically of the order of 0.1 to 0.2 mm,
the punching tolerances (for delimiting the outline of the card body) are typically of the order of 0.3 to 0.5 mm
the tolerances for machining the cavity are typically of the order of 0.05 mm and
the tolerances for inserting the module into the cavity are typically of the order of 0.05 mm.

It is therefore no exaggeration to conclude that the overall tolerances, in terms of root mean square, are of the order of a millimeter.

It will be understood that such drawbacks in terms of complexity and imprecision in the distance between coupling coils may be observed independently of the fact that the electronic entity effectively has one interface for external communication by contact.

BRIEF SUMMARY OF THE INVENTION

The invention aims to overcome the aforementioned drawbacks and to this end proposes an electronic entity comprising a module formed from a carrier film bearing, on a face called the inner face, a microcircuit and a first coupling coil, and a body comprising a cavity in which this module is fixed, the carrier film having a surface called the outer surface running at least approximately alongside a surface called the upper surface of this body, and containing an antenna and a second coupling coil that is connected to this antenna and intended for coupling the antenna to the microcircuit by electromagnetic coupling with the first coupling coil, this second coupling coil being formed over a thickness of at most a few microns in a plane that is located, with respect to the upper surface of the body, at a distance that is less than half the distance to the surface that is opposite this upper surface of this body.

In the context, a low thickness is a thickness at most equal to 10 microns, preferably a thickness at most equal to 5 microns, or even 2 microns, or even a thickness at most equal to one micron.

It advantageously is a question of a microcircuit card, for example a card conforming to the current standards in force, in particular ISO 7816, for example a card of 1FF, 2FF, 3FF or 4FF format in particular, but it may also be a question of cards having other formats, chosen depending on the needs.

The module may comprise contact areas intended to be able to be placed in contact with contact areas of an external reader in a known configuration; the electronic entity is then of the dual-interface type.

Preferably, the antenna and the second coil are formed in one and the same plane.

Again preferably, the antenna and/or the second coil are formed from a conductive ink.

Advantageously, the first coupling coil is formed from a conductive ink; when the antenna and the second coil are also formed from one such conductive ink, a greatly simplified manufacturing process results.

Again advantageously, the antenna and the second coupling coil are formed at the interface between two core layers, the layer that is located above this interface having a thickness that is at most equal to half the thickness of the layer that is located under this interface.

Again advantageously, the antenna and the second coupling coil are formed on the upper surface of the core layer that is closest to the upper surface of the body, and are masked thereby.

Advantageously, the body comprises a single core layer.

Preferably, the antenna and the second coupling coil are covered by a layer of non-conductive masking ink.

Again preferably, the entity comprises an intermediate covering layer between the surface bearing the antenna and the second coupling coil and the upper covering layer, decorative patterns being formed on the intermediate covering layer.

Advantageously, the first coupling coil is opposite the second coupling coil in the direction of the thickness of the body.

Advantageously, as a variant of the preceding paragraph, the first coupling coil is opposite the second coupling coil parallel to the upper surface of the body.

Furthermore, for example, the carrier film of the module bears, on its outer face, contact areas that are intended to be able to be placed in contact with contact areas of an external device in a known configuration.

The invention also proposes, for the manufacture of an electronic entity of the aforementioned type, a method comprising the following steps:

formation of a module comprising a carrier film bearing, on a face called the inner face, a microcircuit and a first coupling coil, formation of at least one core layer, formation, on a surface of this core layer, of a second coupling coil, over a thickness of at most a few microns, lamination of at least this core layer between two covering layers so as to form a body having an upper surface and a lower surface, such that the second coupling coil is situated in a plane that is located at a distance from the upper surface that is at most equal to half the distance from this plane to this lower surface, this body comprising an antenna that is connected to this second coil, formation, in this body, of a cavity, and fixation of this module in this cavity in such a way that the second coil is adapted to interact, by electronic coupling, with the first coil in order to couple the antenna to the microcircuit.

The advantageous features mentioned regarding the electronic entity may be found in the method; in particular, the formation of the module may comprise the formation of contact areas so as to ensure a dual interface; likewise, the body may be shaped so that the entity conforms to one of the current standards.

For example, the formation of the second coil and the formation of the antenna are done by deposition of a conductive ink.

BRIEF DESCRIPTION OF THE DRAWINGS

Aims, features and advantages of the invention are brought to light in the following description, which is given by way of illustrative, non-limiting, example with reference to the appended drawings, in which:

FIG. 1 is a block diagram of an electronic entity having a dual interface,

FIG. 2 is a cross-sectional view of an electronic entity according to the prior art, with 7 laminated layers, FIG. 3 is a cross-sectional view of an electronic entity according to a first embodiment of the invention, FIG. 4 is a cross-sectional view of another electronic entity according to a second embodiment of the invention.

DETAILED DESCRIPTION OF THE PREFERRED EMBODIMENTS

Figure 5:
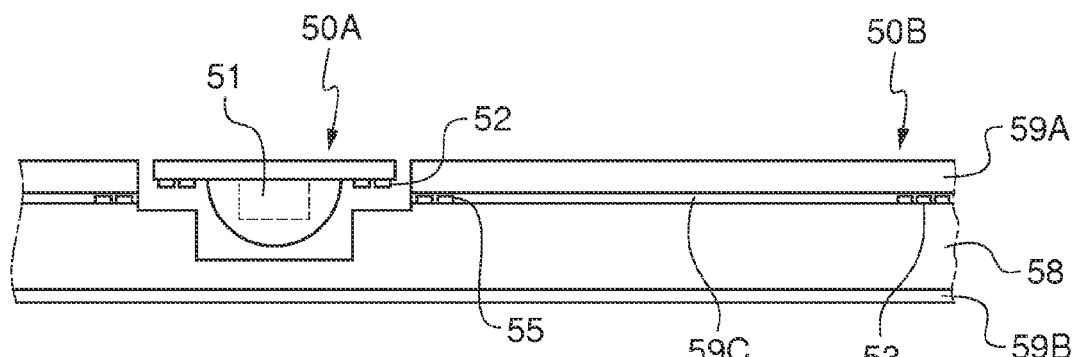
FIG. 5 is a cross-sectional view of another electronic entity according to a variant of this second embodiment of the invention.

FIG. 3 shows a dual-interface electronic entity conforming to the invention.

This entity, denoted by the general reference 30, comprises a body 30B and a module 30A.

The module 30A is similar to that of FIG. 2 in that it comprises a carrier film comprising contacts (not shown) on an outer face (toward the top in FIG. 3) and a microcircuit fixed to its inner face (toward the bottom in this figure), this microcircuit 31 being embedded in a blob of protective resin. Furthermore, a coupling coil 32 is formed on this inner face, laterally removed from the blob of protective resin.

The body 30B here comprises an even number of layers, namely two core layers 38A and 38B and two covering layers 39A and 39B.

The antenna 33 and the second coupling coil 35 are produced by screen printing or by inkjet printing a conductive ink onto one of the faces opposite the core layers; as a result, this antenna 33 and this second coil have a very low thickness, making it unnecessary to make provision for one or more compensating layers; this even makes it unnecessary to make provision for a central carrier layer. This is the reason why, contrary to the structure of FIG. 2, FIG. 3 comprises neither a central carrier sheet nor compensating layers.

Furthermore, the upper core layer 38A has a thickness that is significantly less than that of the lower core layer 38B, an effect of this being that, after lamination, the antenna and above all the second coupling coil are located much closer to the carrier film of the module than in FIG. 2. The upper core layer 38A has, in practice, a thickness at most equal to half that of the lower core layer 38B.

The cavity in which the module is intended to be fixed is formed in a conventional manner, with a peripheral counterbore and a central portion of substantially greater depth, for example of the order of 350 microns. This cavity passes through the upper core layer, inside the turns of the second coil, and penetrates into the lower core layer, the counterbore penetrating only partially into the upper core layer.

Since the first coil is formed on the inner face of the carrier film of the module, to the side of the blob of resin protecting the microcircuit, it follows that this first coil faces the counterbore; it is therefore opposite the bonding material which in practice ensures the fixation of the module to the body.

Since the interface between these core layers is, with respect to FIG. 2, significantly upwardly shifted, it follows that the distance between the coils 32 and 35 may be very small, typically of the order of 100 microns or even less, this distance being the distance between the depth of the counterbore and the depth, with respect to the upper surface, of this interface between core layers.

Thus, the antenna and the second coil are covered by the upper core layer (which is opaque in practice).

The coupling coil 35 formed in the card body advantageously has a geometry at least approximately equal to that of the coupling coil 32 of the module, so that these coils are also, as precisely as possible, opposite each other, without lateral offset.

It will be easily understood that the reduction in the number of layers translates into a substantial simplification of the manufacturing method of such a structure. Furthermore, this reduction in the number of layers allows manufacturing tolerances to be reduced, and therefore the reproducibility of the positioning between the coupling coils to be improved. On account of the small distance that may be guaranteed between the coupling coils, the dimensions of these coupling coils may be reduced, in particular their thicknesses, this confirming the choice of manufacturing these coils by printing. Indeed, the coupling coil of the module is advantageously produced, like the coupling coil of the antenna, by printing.

By way of example, the layers are produced from PVC and have thicknesses of 60 μm (for the layer 39A), 200 μm (for the layer 38A), 480 μm (for the layer 38B), and 60 μm (for the layer 39B), respectively.

The printing ink used to form the antenna and the second coupling coil (and even to form the first coupling coil) is a conductive ink of any known type but it is preferably an ink formed from nanoparticles, such as those commercially available under the brand names "GENES' INK®" and "NANOPCHEM®". Such inks have a very low resistivity relative to conventional inks and may be applied by screen printing or by inkjet printing; it is therefore possible to form films of 0.25 microns thickness with a resistivity of 3 micro-ohms·cm (for comparison, silver has a resistivity of 1.6 micro-ohms·cm). It is understood that consequently, it is correct to consider the thickness of the antenna and of the second coupling coil as being negligible.

FIG. 4 shows another embodiment of an electronic entity conforming to the invention.

As before, this entity, denoted by 40 in its entirety, comprises a module denoted by 40A and a body 40B.

The module 40A may be identical to the module 30A of FIG. 3 with a microcircuit 41 embedded in a blob of resin that is fixed to the inner face of a carrier film on which, furthermore, the first coupling coil 42 is formed.

As for the body 40B, it is different to that of FIG. 3 in that the antenna 43 and the second coupling coil are formed on the upper face of the core layer that is closest to the upper surface of the body. In the example shown, there is only one single core layer 48; of course, this single core layer may be replaced by a pair of superposed core layers, but regardless of the number of core layers, the antenna and the second coil are formed on the upper face of the uppermost layer (in the orientation of FIG. 4).

As above, this antenna and this second coupling coil are produced by printing (by screen printing, by inkjet printing or by any other suitable technique); thus, this antenna and this second coil form only extremely small extra thicknesses. This makes it possible to apply an additional layer of (non-conductive) ink on top of this antenna and this second coil so as to mask this antenna and this second coupling coil; it is sufficient to choose an ink the shade of which is similar to that of the (potentially single, see above) upper core layer, white for example. Thus, the presence of the antenna and of the second coil on the upper surface of the core layer does not mar the esthetics of the body, considering that the covering layer is usually transparent. It will be noted that the fluidity of the layer of non-conductive ink means that the layer formed on the antenna and the second coupling coil and on the rest of the core layer constitutes a sort of low-thickness compensating layer; it is denoted by 49C.

It may be noted that, in the configuration in FIG. 4, the second coupling coil may be located as close to the coupling coil 42 borne by the module as desired.

Indeed, the counterbore surrounding the cavity in FIG. 4 is located at the interface between the upper covering layer and the layer formed by the non-conductive masking ink covering the antenna and the second coil and the rest of the upper surface of the core layer; the gap between the two coupling coils is therefore here defined by the thickness of the layer of non-conductive masking ink.

It will be appreciated that, as in the aforementioned example, the minimization of the number of layers contributes to the simplification of the manufacturing method and makes it possible to obtain, in a highly reproducible manner, a very small separation between the coupling coils.

By way of example, the layers are produced from PVC and have thicknesses of 200 μm (for the layer 49A), 400 μm (for the layer 48) and 200 μm (for the layer 49B), respectively.

The non-conductive ink may be of any suitable known type. It is, for example, a conventional offset or screen-printing ink; it is applied here over a thickness of 3 to 5 μm (for the layer 49C), which allows it to provide effective masking; it has been verified that it does not react with a conductive ink, in particular a nanoparticle-based ink, and remains stable alongside the latter over time and therefore preserves its masking capacity over time.

FIG. 5 is a variant of FIG. 4. The entity that is shown therein under the reference 50 there comprises, like in FIG. 4, a module 50A and a body 50B, the module 50A comprising, like the module 40A of FIG. 4, a microcircuit 51 incorporated in a blob of resin fixed to the inner face of a carrier film and around which a coupling coil 52 is formed.

The body 50B comprises, like the body 40B of FIG. 4, a single core layer 58, on the upper surface of which are formed, by printing a conductive ink, an antenna 53 and a second coupling coil 55 that are covered by a non-conductive masking ink 59C.

In contrast to the configuration of FIG. 4, in which the covering layer 49A is significantly thicker than in the configuration of FIG. 2 or 3, the covering layer 59A of the body 50B has a thickness similar to that of the preceding figures and similar to that of the lower covering layers. As a result of this, on account of the usual thickness of the carrier film of the module, the counterbore is located level with, or slightly below the level of, the interface between the core layer and the upper covering layer; consequently, this counterbore is located level with (or slightly below the level of) the second coupling coil 55; this second coil must therefore, in order to be able to be passed through by the central portion of the cavity and by its counterbore, be of greater size than the first coil 52 borne by the module. In contrast, the separation between these coils 52 and 55 may be composed of only this widening, having no vertical component (these coils are located substantially at the same depth relative to the upper surface of the body).

By way of example, the layers are produced from PVC and have thicknesses of 60 μm (for the layer 59A), 35 μm (for the layer 59C), 680 μm (for the layer 58A) and 60 μm (for the layer 59B), respectively.

Figure 6:
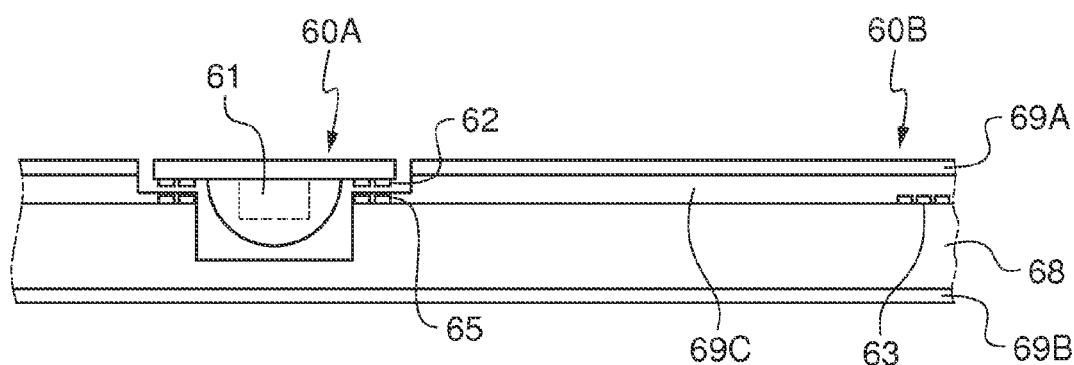
FIG. 6 is a cross-sectional view of another electronic entity according to yet another variant of this second embodiment of the invention.

FIG. 6 shows yet another embodiment of an entity conforming to the invention; the main difference resides in the presence of two covering layers.

In practice, the decorative patterns of the body are formed on the surface located just under the upper covering layer; in the examples of FIGS. 3 to 5, this means that these patterns are produced on the layer of (non-conductive) masking ink.

The electronic entity of FIG. 6 thus comprises a module 60A (similar to the modules of the preceding figures, with a carrier film bearing, on its inner face, a microcircuit 61 and, around the blob of resin incorporating this microcircuit, a first coupling coil 62), and a body 60B comprising a core layer 68 and, on the upper surface of this core layer, an antenna 63 and a coupling coil 65 produced printing a conductive ink.

This body furthermore comprises an upper covering layer 69A and a lower covering layer 69B; this body here furthermore comprises an intermediate covering layer 69C. It is on this intermediate layer that the decorative patterns are formed, and not at the interface where the antenna and the second coupling coil are formed.

This covering layer may be opaque and mask the antenna and the second coupling coil; as a variant and preferably, it is itself transparent, the decorative patterns themselves masking the antenna and this second coil.

By way of example, the layers are produced from polycarbonate as regards the transparent layers (the covering layers) and from PVC, and have thicknesses of 100 μm (for the layer 69A), 100 μm (for the layer 69C), 500 μm (for the layer 68), and 100 μm (for the layer 69B), respectively.

Needless to say, as a variant of FIG. 6, the second coil may, by analogy with FIG. 5, be located at least approximately at the same level (from the point of view of depth) as the first coil, while encircling the latter. In fact, the various variants mentioned above in relation to the various figures may be combined, depending on the needs or the preferences of the designer.

Figure 7:
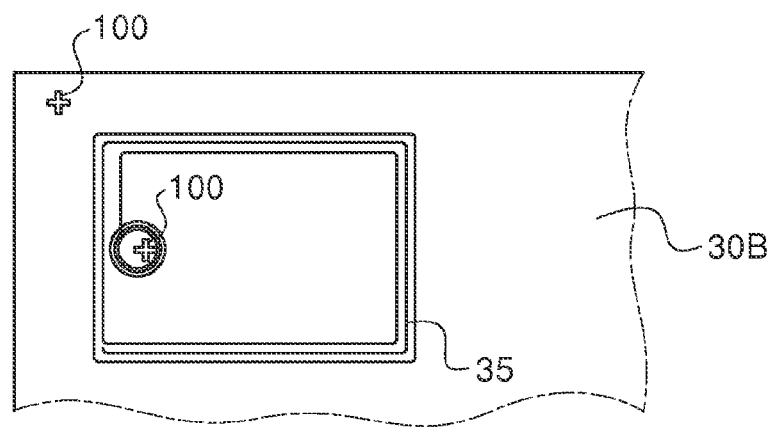
FIG. 7 is a view from above of a portion of the body of FIG. 3.

It will be noted that the formation, by printing, of the antenna and of the second coil may be accompanied by the formation de registration marks. Thus FIG. 7 diagrammatically shows a portion of card body, here a portion of the card body of FIG. 3; there thus may be seen, through the transparent covering layer, not only the second coil 35 (the antenna has been omitted, for the sake of simplicity of the drawing) but also marks 100. It will easily be understood that these marks 100 allow for very high precision at the moment of forming, by machining, the cavity and its counterbore, thereby contributing to guaranteeing a very high reproducibility of the relative configuration between the two coupling coils.

It may be noted that the various examples described above have in common that they represent an electronic entity (here having a dual interface), for example of the microcircuit-card type according to the current standards in force, in particular ISO 7816, comprising a module formed from a carrier film bearing (in combination, preferably, with, on a face called the outer face, contact areas that are intended to be placed in contact with contact areas of an external reader, in a known configuration), on a face called the inner face, a microcircuit and a first coupling coil, and a body comprising a cavity in which this module is fixed, the outer surface running at least approximately (with a tolerance that may be of the order of several hundred microns) alongside a surface called the upper surface of this body, and containing an antenna and a coupling coil that is connected to this antenna and intended for coupling the antenna to the microcircuit by electromagnetic coupling with the first coupling coil, this second coupling coil (or even the antenna) being formed, over a thickness of at most a few microns (here by deposition of a conductive ink), in a plane that is located, with respect to the upper surface of the body, at a distance that is less than half the distance to the surface that is opposite this upper surface of this body.

Advantageously, the first coil is located in a plane parallel to that of the antenna and of the second coil, and is itself also preferably formed from a conductive ink.

It should be noted that, when the antenna and the second coupling coil are formed from a conductive ink, their thicknesses are very small, of the order of at most five microns, this being an extra thickness requiring no compensation within a superposition of layers.

In general, the various examples described above are manufactured according to the following steps:

formation of a module comprising a carrier film bearing, on a face called the inner face, a microcircuit and a first coupling coil, formation of at least one core layer, formation, on a surface of this core layer, of a second coupling coil, over a thickness of at most a few microns (here by deposition of a conductive ink), lamination of at least this core layer between two covering layers so as to form a body having an upper surface and a lower surface, such that the second coupling coil is situated in a plane that is located at a distance from the upper surface that is at most equal to half the distance from this plane to this lower surface, this body comprising an antenna that is connected to this second coil, formation, in this body, of a cavity, and fixation of this module in this cavity in such a way that the second coil is adapted to interact, by electromagnetic coupling, with the first coil in order to couple the antenna to the microcircuit.

It will be easily understood that the invention is particularly applicable to microcircuit cards of the standardized type known by the name ID-1 or 1FF, but is also applicable to cards of ID-000 or 2FF type, or even to smaller formats such as 3FF or 4FF.

Various variants of the preceding may be envisaged, for example the formation of the antenna and of the second coil at different levels, for example formed on the respective faces of a core layer and being connected by vias.

The invention claimed is:

1. Electronic entity comprising a module (30A, 40A, 50A, 60A) formed from a carrier film bearing, on a face called the inner face, a microcircuit (31, 41, 51, 61) and a first coupling coil (32, 42, 52, 62), and a body (30B, 40B, 50B, 60B) comprising a cavity in which this module is fixed, the carrier film having a surface called the outer surface running at least approximately alongside a surface called the upper surface of this body, and containing an antenna (33, 43, 53, 63) and a second coupling coil (35, 45, 55, 65) that is connected to this antenna and intended for coupling the antenna to the microcircuit by electromagnetic coupling with the first coupling coil, this second coupling coil being formed over a thickness of at most a few microns in a plane that is located, with respect to the upper surface of the body, at a distance that is less than half the distance to the surface that is opposite this upper surface of this body.

2. The entity according to claim 1, wherein the antenna and the second coil are formed in one and the same plane.

3. The entity according to claim 2, wherein the antenna and/or the second coil are formed from a conductive ink.

4. The entity according to claim 2, wherein the first coupling coil is formed from a conductive ink.

5. The entity according to claim 2, wherein the antenna and the second coupling coil are disposed at the interface between two core layers, the layer that is located above the interface having a thickness that is at most equal to half the thickness of the layer that is located under the interface.

6. The entity according to claim 2, wherein the antenna and the second coupling coil are disposed on the upper surface of the core layer that is closest to the upper surface of the body, and are masked thereby.

7. The entity according to claim 1, wherein the antenna and/or the second coil are formed from a conductive ink.

8. The entity according to claim 1, wherein the first coupling coil is formed from a conductive ink.

9. The entity according to claim 1, wherein the antenna and the second coupling coil are disposed at the interface between two core layers, the layer that is located above the interface having a thickness that is at most equal to half the thickness of the layer that is located under the interface.

10. The entity according to claim 1, wherein the antenna and the second coupling coil are disposed on the upper surface of the core layer that is closest to the upper surface of the body, and are masked thereby.

11. The entity according to claim 10, wherein the body comprises a single core layer.

12. The entity according to claim 11, wherein the antenna and the second coupling coil are covered by a layer of non-conductive masking ink.

13. The entity according to claim 10, wherein the antenna and the second coupling coil are covered by a layer of non-conductive masking ink.

14. The entity according to claim 10, further comprising an intermediate covering layer between the surface bearing the antenna and the second coupling coil and the upper covering layer, decorative patterns being formed on the intermediate covering layer.

15. The entity according to claim 1, wherein the first coupling coil is opposite the second coupling coil in the direction of the thickness of the body.

16. The entity according to claim 1, wherein the first coupling coil is opposite the second coupling coil parallel to the upper surface of the body.

17. The entity according to claim 1, further comprising a microcircuit card of the 1FF, 2FF, 3FF or 4FF type.

18. The entity according to claim 1, wherein the carrier film of the module bears, on its outer face, contact areas that are configured to be placed in contact with contact areas of an external device in a known configuration.

19. A method for manufacturing the dual-interface electronic entity of claim 1, the method comprising:
    forming a module comprising a carrier film bearing, on an inner face, a microcircuit and a first coupling coil;
    forming at least one core layer;
    forming, on a surface of the core layer, a second coupling coil, over a thickness of at most a few microns;
    laminating at least the core layer between two covering layers to form a body having an upper surface and a lower surface, such that the second coupling coil is situated in a plane that is located at a distance from the upper surface that is at most equal to half the distance from this plane to this lower surface, the body comprising an antenna that is connected to the second coil;
    forming, in the body, a cavity; and
    fixing the module in the cavity such that the second coil is configured to interact, by electronic coupling, with the first coil in order to couple the antenna to the microcircuit.

20. The method according to claim 19, wherein the forming of the second coil and the forming of the antenna occur by deposition of a conductive ink.

* * * * *